United States Patent [19]
Matunami

[11] 3,952,404
[45] Apr. 27, 1976

[54] BEAM LEAD FORMATION METHOD

[75] Inventor: Mituo Matunami, Izumisano, Japan

[73] Assignee: Sharp Kabushiki Kaisha, Osaka, Japan

[22] Filed: Mar. 29, 1974

[21] Appl. No.: 456,269

[30] Foreign Application Priority Data
July 30, 1973 Japan.............................. 48-85651
July 31, 1973 Japan.............................. 48-86500
Sept. 25, 1973 Japan............................ 48-108829

[52] U.S. Cl................................. 29/589; 29/590; 29/591; 357/69
[51] Int. Cl.² ......................................... B01J 17/00
[58] Field of Search ............. 29/576, 580, 589, 590, 29/591, 578

[56] References Cited
UNITED STATES PATENTS 3,112,850  12/1963  Garibotti.............................. 29/580
3,706,127  12/1972  Oktay................................... 29/576
3,771,219  11/1973  Tuzi..................................... 29/580

Primary Examiner—W. Tupman
Attorney, Agent, or Firm—Stewart and Kolasch, Ltd.

[57] ABSTRACT

The present disclosure is directed toward a method for making semiconductor devices having beam leads for electrical connections to external terminals. An undercoating metal film is deposited directly or via a protective film on a semiconductor wafer on which interconnections are formed together with electrode pad or contact areas. After subsequent deposition of an upper metal film, beam leads are formed in a desired pattern in a manner to contact with and extend from the electrode areas. The final step is to apply physical force to the semiconductor wafer such that the undercoating metal film serving also as a portion of the beam leads is forcibly spaced away from the major surface of the semiconductor wafer.

10 Claims, 16 Drawing Figures

BEAM LEAD FORMATION METHOD

BACKGROUND OF THE INVENTION

In recent years, one of the improvements in electric contact techniques in the semiconductor art has been the development of a wireless bonding method, which is also called the beam lead bonding method. The prior art is represented by, for example, U.S. Pat. No. 3,550,261, which discloses a process wherein electrode pads or contact areas are formed on a semiconductor wafer, the surface of which is partly covered by a protective film, and a conductive selectively adhering material is deposited over the protective film, the conductive material adhering to the contact area but not adhering to the protective film.

However, it is very difficult to deposit a material of such characteristics. Since strict requirements are imposed on the selection of the selectively adhering film, the various conductive metal materials usually employed are not equally applicable to the deposition of such a film.

In addition, as disclosed in U.S. Pat. No. 3,590,478, an oxidation film covering the surface of a semiconductor wafer is selectively etched to expose desired electrode pads or contact areas, and then the surface of the semiconductor wafer except the electrode areas is coated with a photo-resist material. Thereafter, beam leads are formed to extend over the photo-resist film. One of the disadvantages of this prior art method is that the semiconductor wafer cannot be treated at a considerably high temperature because of the use of the photo-resist material. Consequently, it is not possible to obtain beam leads having strong bonding by this technique.

OBJECTS AND SUMMARY OF THE INVENTION

Accordingly, a primary object of the present invention is the provision of a method for making semiconductor devices which allows flexibility of material selection for the protective film which covers the surface of a semiconductor wafer and for the beams leads bonded thereon.

Another object of the present invention is to provide semiconductor devices which have multi-layer beam leads strongly adhering to electrode pads or contact areas, but not to the remaining surface of the semiconductor wafer.

A further object of the present invention is the provision of semiconductor devices wherein beam leads are forcibly spaced away from the surface of a semiconductor wafer to isolate them from the wafer surface by means of a physical force such as ultrasonic vibration and magnetic attraction.

Still another object of the invention is the provision of a beam lead construction for semiconductor devices wherein at least the contact regions of the multi-layer beam leads are coated with a low melting point metal material or a metal which may be alloyed with the beam leads or external electrical connections to facilitate thermocompression bonding.

A further object of the present invention is to provide an electrical connection arrangement for semiconductor devices which comprises an additional electrode pad previously formed to strengthen the joining of beam leads with electrode pads or contact areas of a semiconductor wafer formed during the same process for deposition of interconnections on the wafer.

Yet another object of the present invention is the provision of a process for making semiconductor devices which involves the step of vapor depositing an undercoating metal film directly over the surface of a semiconductor wafer to facilitate the separation of beam leads from the wafer surface.

Still a further object of the present invention is the provision for the process for making semiconductor devices which involves heat treatment to cure damage occuring during the vapor deposition procedure for making an additional electrode pad or contact area over previously formed electrode areas.

These and other objects and advantages of the present invention will become apparent to those skilled in the art from a consideration of the following specification and claims, taken in conjunction with the accompanying drawings.

Briefly, in accordance with the teachings of the present invention, in a semiconductor wafer on which one or more circuit elements are formed in a desired pattern by well known methods such as impurity diffusion, photoetching, and the like, and then these circuit elements or their electrode pads are interconnected together by means of single or multi-layer metal films, there is first deposited an undercoating metal film, except at least the electrode pad areas, which weakly adheres to the wafer surface. The next step is to form an upper metal film which strongly adheres to the undercoating metal film and the electrode pad areas. After removal of non-selected portions of these metal films, beam leads are formed in a desired pattern over only the selected portions. Subsequently, upon application of a physical force, the undercoating metal film is forcibly spaced away from the surface of the semiconductor wafer. Finally, individual chips on the semiconductor wafer are separated by backside scribing.

DEETAILED DESCRIPTION OF THE PREFERRED EMBODIMENTS

The beam lead formation method of the present invention briefly described in the foregoing will now be discussed in greater detail with reference to preferred embodiments illustrated in the accompanying drawings.

The first embodiment of the present invention described below consists essentially of the deposition of aluminum interconnections on a silicon semiconductor wafer containing a plurality of desired semiconductor chips and the formation of gold-plated beam leads on the semiconductor wafer. More particularly, referring to FIG. 1, there is deposited over the surface of a silicon semiconductor wafer 1 an insulating protective film 2 made of an oxide or nitride. A number of active and passive elements are incorporated therein by the use of techniques conventionally employed in the semiconductor art as the protective film 2 serves as a mask for impurity diffusion. Then, electrode apertures are formed in selected portions of the protective film 2 and electrode pads or contact areas 4 are deposited at positions suitable for the provision of the aluminum interconnections and beam leads to be described hereinafter.

Figure 1:
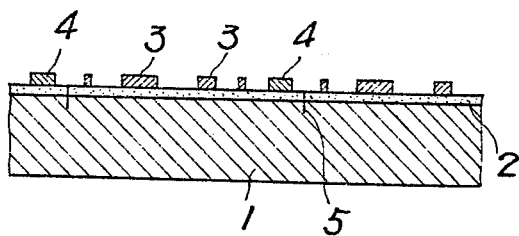
FIGS. 1-5 are sectional views of a semiconductor wafer as it appears during the course of a process carried out in accordance with the first embodiment of the present invention.
Figure 2:
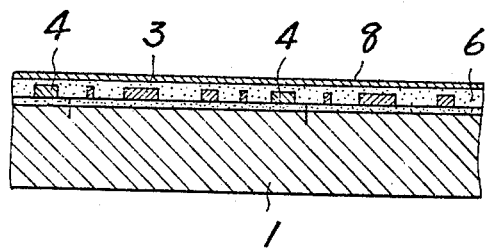

In order to separate the wafer 1 into individual semiconductor chips after the formation of the beam leads, it is necessary to draw scribe lines 5 at the boundaries between the adjacent chips on either the upper surface or the rear surface of the wafer (the upper surface is shown in FIG. 1). As shown in FIG. 2, a heat-resisting protective film 6 of an oxide or nitride is deposited over the wafer 1, which protects the interconnections from heat occuring during the deposition of auxiliary electrode pads 7 on the electrode pads 6 discussed below.

Figure 3:
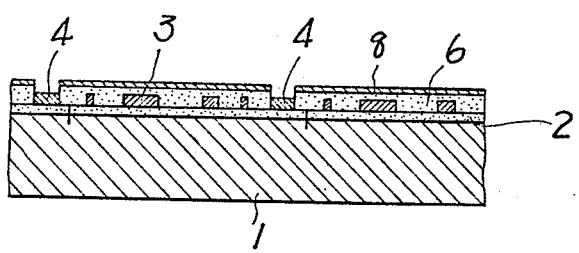

A first metal film 8, for example, iron, which serves as the undercoating when it is desired to form beam leads, is deposited on the surface of the wafer 1 by vacuum evaporation and the protective film 6 and the first metal film 8 over the electrode pads 4 are then removed, resulting in the wafer shown in FIG. 3.

The first metal film 8 plays an important role in the present invention because it forms a portion of the beam leads together with the gold-plated film described below. This adheres firmly to the following upper metal film but not to the protective film 6 and the surface of the wafer 1 excepting the electrode pads. It will be noted from the following description that the first metal film 8 is selected from proper metal members having such an affinity with the electrode areas and the wafer surface that it may be separated away from the surface of wafer 1 as a whole, while leaving an end portion thereof bonded to the electrode pads 4 when a physical force is applied to the semiconductor wafer 1. For example, in the case where magnetism is employed as said physical force, the first metal film undercoating metal film is selected from a magnetic material such as nickel, cobalt, iron or a permalloy (nickel-iron alloys containing from 40 to 80 percent by weight of nickel), while the second metal film (that is, the beam leads) and electrode pads comprise a non-magnetic material such as gold, solver or copper. Alternatively, in the case that ultrasonic vibration is utilized as said physical force, the first metal film 8 is selected from appropriate metals, for example, gold, copper, nickel, tin, zinc, etc., so that it may be separated or spaced away from the protective film in the case of the wafer being covered with the protective film or the interconnection films in the case where the wafer is not covered with the same because of the ultrasonic vibration. Although beam leads may be deposited on the aforementioned electrode pads 4 shortly thereafter, it is desirable that suxiliary electrode pads be added to the electrode pads 4 to ensure a tight bonding of the wafer and beam leads. The auxiliary electrode pads also provide an electrode useful for selective plating during the formation of the beam leads.

Figure 4:
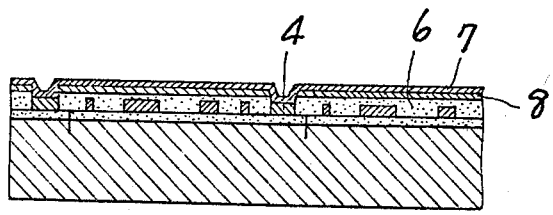

A combination of titanium or chromium having a good adherent nature and nickel, platinum or copper, which provides the possibilities of being plated with gold but not of reacting with the above-mentioned titanium or chromium, is deposited over the electrode pads 4 of the wafer 1 and the first metal film 8 by consecutive evaporation processes. This deposition results in the formation of a metal film 7 on the surface of wafer 1 as is shown in FIG. 4. It is to be understood that the bonding of this titanium deposition film to the electrode pads 4 materially assists the bonding of the beam leads discussed below to the electrode pads 4.

In the prior art, it is very difficult to heat the wafer to a sufficiently high temperature for the purpose of improving the bonding between the aluminum and titanium because of the use of a photo-resist material as a protective film for the aluminum interconnection films. In contrast thereto, in the illustrative embodiments discussed herein the use of the protective film 6 having a high degree of thermal stability such as silicon dioxide allows an increase in the temperature of the wafer 1 to a considerably high temperature of approximately 350°C., thereby enhancing the bonding of the aluminum electrode pads 4 and the titanium deposition film. Accordingly, the temperature of the wafer 1 can be increased to a relatively high temperature which is permissible and necessary for the aluminum interconnections to give satisfactory results wherein a close and good bonding is obtainable by virtue of the increase of temperature to, for example, 300°C.

Figure 5:
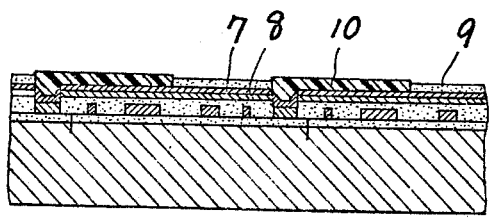

After the first metal film 8 is deposited in this way and the electrode pads 7 are added to obtain close coupling, the mask 9 as shown in FIG. 5 is created on the wafer 1 in accordance with a desired beam lead pattern by employing photoetching techniques, and then a second metal film 10 is deposited extending from the electrode pads 4 to the first metal film 8 by employing selective plating techniques wherein the metal film 7 serves as one of the plating electrodes. Although the metal film 7, which is contributive to the auxiliary electrode pads, is vapor-evaporated and deposited on the first metal film 8 (iron), it is possible as an alternative that the formation of the first metal film be made subsequent to that of the additional electrode pads, as will be clear from the following discussion.

Figure 6:
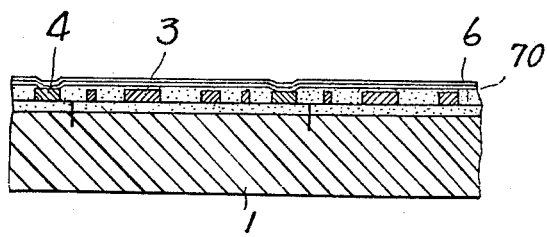
FIGS. 6-11 are sectional views of a semiconductor wafer made by a modification in the first embodiment illustrated in FIGS. 1 to 5.
Figure 7:
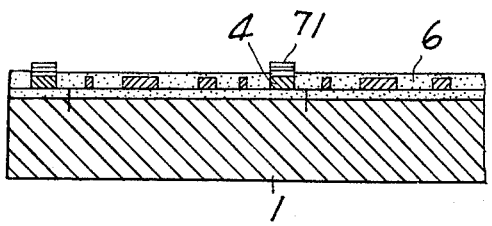

As an alternative embodiment, the protective silicon dioxide film 6 is deposited on a portion of the wafer surface except the electrode pads 4 shown in FIG. 1, and then the additional electrode pad, or the metal film 70 shown in FIG. 6, is deposited by consecutive deposition of titanium and platinum. A portion of the platinum deposition film, except that corresponding to the electrode pads 4, is withdrawn therefrom, and only the platinum deposition film is plated with gold to establish an additional electrode pad 7 consisting of a metal film of multi-layer construction of titanium, platinum and gold. Thereafter, the non-selected titanium deposition film is removed by etching to obtain the semiconductor wafer shown in FIG. 7.

Figure 8:
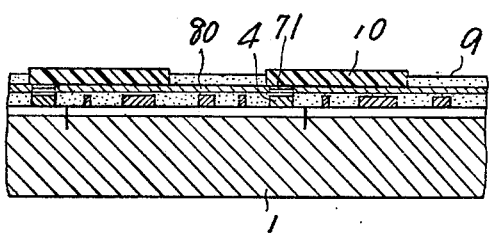
Figure 9:
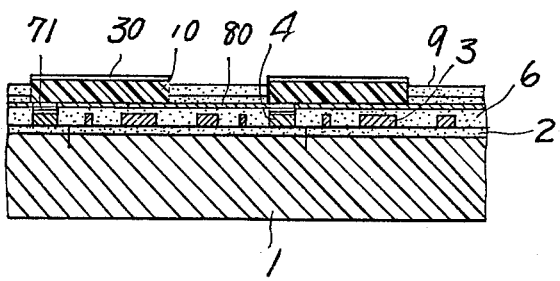

In general, there is a great tendency for radioactive rays occurring during the vapor-evaporating or spattering steps for obtaining the metal films such as those of titanium, platinum, etc., to damage the semiconductor wafer. In order to cure such damage, the semiconductor wafer is annealed under the following conditions of an atmosphere of inert gas, for example, nitrogen or helium, a temperature of about 450°C. and a time period of about 20 minutes. This annealing procedure eliminates most of the disadvantages associated with the new electrode pads 70 of multi-layer metal construction. After the new electrode pads 71 are formed, the first metal film 80 (for example, nickel), which is equivalent to the first metal film 8 discussed above, is then applied over the surface of the semiconductor except for the electrode pads 71. The film 80 is painted with a photo-resist film and selectively plated with gold to provide a second metal film or upper metal film 10. The resultant semiconductor wafer is shown in FIG. 8. In this way, the beam leads consisting of the lower and upper metal films are installed on the surface of the semiconductor wafer 1. Subsequently, a conventional plating technique may be used to provide a third metal film 30 having a thickness of several microns to be used for external connections on at least a portion of the upper metal film 80. This film is made of any metal material, including low melting point metals or other metals which may be alloyed with the second metal film or the external connections. Tin is a suitable plating metal in this regard.

In bonding semiconductor chips having beam leads to a wiring board, the corresponding wiring portion of the board and the beam leads are both subject to, for example, the conventional thermocompression procedure known in the art. Hence, as an illustration, a low melting point metal material may be utilized to allow alleviation in heat and pressure. For example, if tin is deposited over the gold-plated film as discussed in connection with the illustrative embodiment, a eutectic reaction occurs between both of the metal films at a relatively low temperature of about 220°C., resulting in an alloy of both metal materials which ensures a close bonding of the semiconductor devices to the wiring board. It will be noted that the third metal film may be comprised of a soldering alloy of lead and tin or a ternary alloy of lead, tin and zinc, in addition to the aforementioned film obtained by tin plating.

Figure 10:
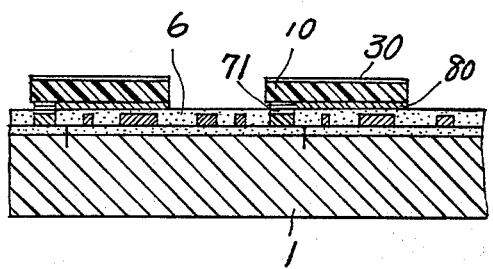
Figure 11:
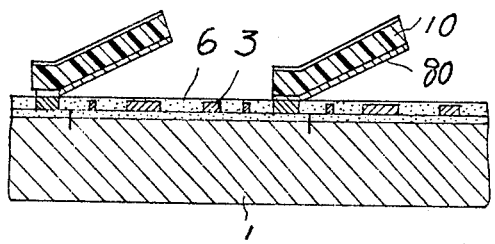

After the selective plating process, the waste mask 9 is withdrawn therefrom along with the unnecessary portion of the first metal film 80 to provide the wafer having the beam leads as shown in FIG. 10. In order that the first metal film 80 is separated or spaced away from the wafer surface, the first metal film 80 is selected from a suitable magnetic material such as nickel, cobalt, iron, permalloys or the like. In addition, the second metal film is selected from gold, silver or the like. Under these circumstances, a magnetic field is established perpendicular to the wafer such that the beam leads can be separated or spaced from the wafer surface because of the physical force which is exercised upon the first metal film 80, as illustrated in FIG. 11. Alternatively, the first metal film may consist of an appropriate metal material such as gold, copper, nickel, silver, tin, zinc or the like which does not strongly adhere to the protective films or interconnection films. The physical force, for example, ultrasonic vibrations, causes the first metal film forming a portion of the beam leads to be separated from the wafer surface. During these processes, the one end portion of the beam leads in no way separates from the wafer since they are tightly bonded to the electrode pads through the additional electrode pads 71.

In the event that the first metal film may operate as the heat-resisting protective film during the vapor evaporation process wherein the additional electrode pads 7 are developed, it becomes unnecessary to form a special heat-resisting protective film such as silicon dioxide. In this instance, the first metal film can be deposited directly over the surface of the interconnected wafer under the condition that the first metal film does not adhere strongly to the silicon dioxide film or interconnection films on the wafer. This is achieved readily by reducing the temperature of the semiconductor wafer or by reducing the degree of vacuum during the evaporation process. In this way, the lower metal film is immediately vapor-evaporated over the surface of the semiconductor wafer in such a way that it may be readily separated or spaced away from the surface of the semiconductor wafer. This avoids having to establish an insulating film between the beam leads and the semiconductor wafer, as was done in the prior art, and provides simplicity in the manufacturing process together with a flexibility of material selection.

Although the embodiment set forth above includes the step of forming the additional electrode pads to ensure tight bonding between the beam leads and the electrode pads since the former are formed by aluminum evaporation and the latter are formed by aluminum plating, this step may be omitted by a proper selection of the previously formed electrode pads and beam leads. For example, in the case where the interconnections and electrode pads are made up of a multi-layer metal material, as practiced in the design of integrated circuits, the first metal film is deposited over the semiconductor wafer except for the portion of the multi-layer electrode pads by applying the vapor evaporation technique thereto and, subsequently, the second metal film is deposited thereon in accordance with the beam lead pattern by application of the selective plating technique. Thereafter, the plating mask and waste region of the first metal film are removed, and the first metal film is separated from the surface of the wafer upon the application of physical force to the wafer. It will be noted that the first metal film is selected from any metal material which adheres closely to the second metal film but not to interconnections and protective films on the wafer surface.

Figure 12:
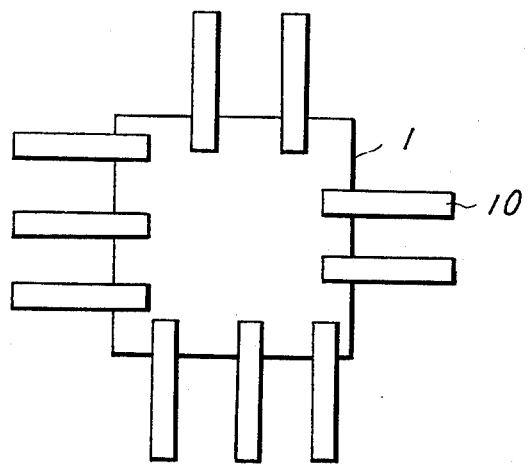
FIG. 12 is a plan view of the resultant semiconductor devices made by the method of said first embodiment.

As described hereinbefore, the thus-obtained beam leads are bonded at one of the ends thereof and are spaced at the extensions thereof from the wafer surface. Thereafter, the individual chips are separated by back-side scribing 5. The resulting semiconductor chips provided with the desired beam leads are depicted in FIG. 12.

Figure 13:
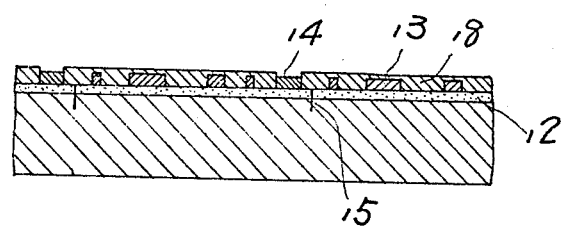
FIGS. 13-16 are sectional views of a semiconductor wafer made in accordance with a second embodiment of the present invention.

Another embodiment wherein aluminum interconnections are deposited over a silicon semiconductor wafer and wherein beam leads are formed thereon by means of aluminum evaporation is shown in FIGS. 13-16. In FIG. 13, a variety of circuit elements including active elements and passive elements are incorporated in the silicon semiconductor wafer 11 and interconnections 13 and electrode pads or contact areas 14 are provided in accordance with a desired pattern over the surface of the wafer 11, which is covered with the oxide or nitride film 12, for the purpose of connecting the individual circuit elements together and connecting one element to another element. Scribe lines 15 are drawn on the wafer 11 which mark boundaries between the semiconductor chips.

The forming of a first metal film 18 (for example, nickel) over the surface of the wafer 11 except for the electrode pad areas 14 is effected by conventional techniques, for example, vapor evaporation. This operates as an undercoating film or a portion of the beam leads and has the property of adhering weakly to the protective film 12 and interconnections 13 and the like such that it may be separated or spaced away from the wafer while leaving the electrode areas bonded thereto, and has a close adherence to the second metal film serving as a major portion of the beam leads as set forth below.

Figure 14:
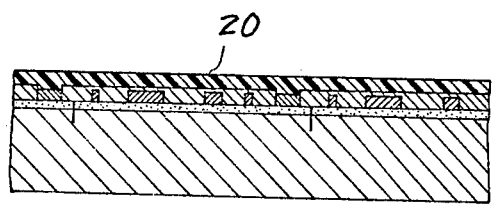

Next, the second metal film 20 is deposited over the wafer 11 to a thickness of no less than approximately 15 microns by aluminum deposition to complete the formation of the beam leads, as is shown in FIG. 14. The adherence property is greatly dependent on the nature of the material evaporated and of the substrate which receives such material, as well as on the various evaporation conditions such as the temperature of the substrate. In this embodiment, a temperature of about room temperature during the formation of the first film or nickel deposition and temperature of about 300°C. during the formation of the second film or aluminum deposition were used and found to give satisfactory results.

Figure 15:
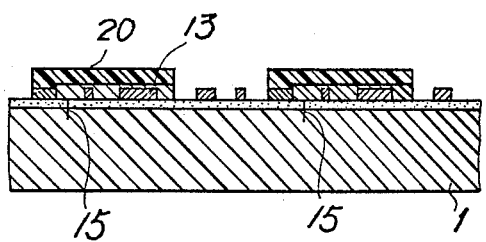
Figure 16:
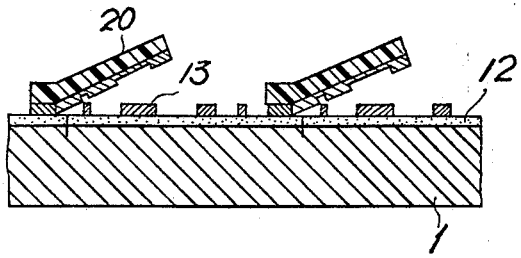

To define the first and the second metal films in a desired beam lead pattern, a mask is placed over the second metal film 20 and non-selected portions of both of the metal films are removed, as illustrated in FIG. 15. This is accomplished by any conventional technique such as photoetching. Thereafter, ultrasonic vibrations are applied to the wafer, causing the first metal film 18 to be spaced and insulated from the wafer surface. The resulting structure, shown in FIG. 16, has beam leads which are electrically connected at the electrode pads which constitute internal circuits in the wafer. Backscribing is carried out under the scribe lines 15 to separate the individual semiconductor chips from each other, as shown in FIG. 12.

In the event that there is poor adhesion between the semiconductor wafer and the first metal film, a force can be utilized to separate the individual chips so as to eliminate the need for a special physical force such as ultrasonic vibration.

Other materials that may be employed as a substitute for the aluminum interconnections are molybdenum, tungsten, silver and other metals of a single-layer construction, and titanium-molybdenum, chromium-silver, titanium-nickel-gold and other metals of a multi-layer construction. Other materials that may be used as beam leads, rather than aluminum, include copper, gold and the like.

Thus, there have been shown and described in the present application fabrication techniques for the purpose of beam leads of a single-layer construction. Of course, it is to be understood that the present invention is applicable to processes of forming beam leads of a multi-layer construction.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method of making semiconductor devices having a predetermined number of beam leads for electrical connections to external terminals, said method comprising the steps of:
   preparing a semiconductor wafer including one or more circuit elements thereon;
   forming a predetermined number of electrode pads to which the corresponding beam leads are connected;
   depositing over the surface of the semiconductor wafer except the electrode pads an undercoating metal film which does not adhere strongly to the wafer surface;
   forming in a desired pattern a metal film which adheres closely to the electrode pads and the undercoating metal film and forms the aforementioned beam leads;
   applying physical force to the semiconductor wafer in order to cause the undercoating metal film to be spaced away from the surface; and
   dividing the semiconductor wafer into a plurality of semiconductor devices.

2. A method as defined in claim 1, wherein, the physical force is ultrasonic vibrations which causes the undercoating metal film to be spaced away from the wafer surface.

3. A method as defined in claim 1, wherein the undercoating metal film has magnetic properties and the physical force is a magnetic force applied to the semiconductor wafer which causes the undercoating metal film to be spaced and separated away from the wafer surface.

4. A method as defined in claim 1, including the additional step of forming an auxiliary electrode pad between the previously formed electrode pad and the beam lead.

5. A method as defined in claim 1, including the additional step of depositing insulating material over the wafer surface except the electrode pads after the forming of the electrode pads, the undercoating metal film being deposited over such insulating material.

6. A method as defined in claim 1, wherein at least a portion of the beam lead to be connected to the external terminal is coated with a low melting-point metal material.

7. A method as defined in claim 1, wherein at least a portion of the beam lead to be connected to the external terminals is coated with a low melting-point metal material which may be alloyed with the beam lead or the external terminal.

8. A method as defined in claim 4, wherein the forming of the auxiliary electrode pads is by vapor evaporation and thermal treatment is carried out to cure any radiation damage after caused by the vapor evaporation.

9. A method of making semiconductor devices having a predetermined number of beam leads for electrical connections to external terminals, said method comprising the steps of;
   preparing a semiconductor wafer including one or more circuit elements thereon;
   forming a predetermined number of electrode pads to which the corresponding beam leads are to be connected;
   depositing a heat-resisting protective film over the semiconductor wafer;
   depositing over the surface of the protective film a first undercoating metal film which does not adhere strongly to the wafer surface;
   removing the protective film and the undercoating metal film over the area of the electrode pads;
   depositing an auxiliary electrode metal film over the undercoating metal film and the surface of the electrode
   depositing a second metal film on the auxiliary electrode metal film and extending to the electrode pads, said first undercoating metal film and the second metal film forming the beam leads;
   applying physical force to the semiconductor wafer in order to cause the first undercoating metal film to be spaced away from the wafer surface; and
   dividing the semiconductor wafer into a plurality of semiconductor devices.

10. A method of making semiconductor devices having a predetermined number of beam leads for electrical connections to external terminals, said method comprising the steps of:
  preparing a semiconductor wafer including one or more circuit elements thereon;
  forming a predetermined number of electrode pads to which the corresponding beam leads are to be connected;
  depositing a heat-resisting protective film over the semiconductor wafer, except for the electrode pads;
  depositing a metal film over the heat-resisting film and the electrode pads;
  removing said metal film from the heat-resisting protective film except that portion corresponding to the electrode pads;
  depositing an additional multi-layered metal film over the electrode pads;
  annealing the semiconductor wafer;
  applying a first undercoating metal film to the surface of the semiconductor wafer except for the electrode pads, which does not adhere strongly to the wafer surface;
  depositing a second film on the first undercoated metal film and the electrode pads;
  applying physical force to the semiconductor wafer in order to cause the first undercoating metal film to be spaced away from the wafer surface; and
  dividing the semiconductor wafer into a plurality of semiconductor devices.

* * * * *